(12) United States Patent
Neal

(10) Patent No.: US 8,419,857 B2
(45) Date of Patent: Apr. 16, 2013

(54) ELECTRON BEAM VAPOR DEPOSITION APPARATUS AND METHOD OF COATING

(75) Inventor: James W. Neal, Ellington, CT (US)

(73) Assignee: United Technologies Corporation, Hartford, CT (US)

( * ) Notice: Subject to any disclaimer, the term of this patent is extended or adjusted under 35 U.S.C. 154(b) by 984 days.

(21) Appl. No.: 12/414,697

(22) Filed: Mar. 31, 2009

(65) Prior Publication Data

US 2010/0242841 A1 Sep. 30, 2010

(51) Int. Cl.
*C23C 16/00* (2006.01)

(52) U.S. Cl.
USPC .......................................... 118/726; 118/727

(58) Field of Classification Search .................. 118/726, 118/727
See application file for complete search history.

(56) References Cited

U.S. PATENT DOCUMENTS

| | | | |
|---|---|---|---|
| 4,153,005 A | 5/1979 | Norton | |
| 5,087,477 A | 2/1992 | Giggins, Jr. | |
| 5,372,837 A | 12/1994 | Shimoyama et al. | |
| 5,534,314 A | 7/1996 | Wadley | |
| 5,601,652 A | 2/1997 | Mullin | |
| 5,736,073 A | 4/1998 | Wadley | |
| 5,846,608 A | 12/1998 | Neumann | |
| 5,932,078 A | 8/1999 | Beers | |
| 6,042,898 A | 3/2000 | Burns | |
| 6,172,331 B1 | 1/2001 | Chen | |
| 6,210,744 B1* | 4/2001 | Hayess et al. | 427/8 |
| 6,255,001 B1 | 7/2001 | Darolia | |
| 7,329,436 B2 | 2/2008 | Belousov | |
| 2003/0079837 A1* | 5/2003 | Hirai et al. | 156/345.31 |
| 2004/0134430 A1* | 7/2004 | Hass et al. | 118/723 EB |
| 2005/0255242 A1* | 11/2005 | Hass et al. | 427/248.1 |
| 2006/0062912 A1* | 3/2006 | Wortman et al. | 427/248.1 |
| 2008/0160171 A1 | 7/2008 | Barabash | |
| 2009/0017217 A1* | 1/2009 | Hass et al. | 427/446 |

FOREIGN PATENT DOCUMENTS

| | | |
|---|---|---|
| CN | 101144149 | 3/2008 |
| EP | 1970463 | 9/2008 |
| EP | 2166127 | 3/2010 |
| JP | 9293239 | 11/1997 |
| JP | 2005088431 | 4/2005 |
| WO | 9965626 | 12/1999 |
| WO | 03/028428 | 4/2003 |
| WO | 2006027106 | 3/2006 |
| WO | 2007005832 | 1/2007 |

OTHER PUBLICATIONS

Search and Examination Report by the Hungarian Patent Office, Sep. 2011.
Partial European Search Report dated Dec. 3, 2010.

(Continued)

*Primary Examiner* — Keath Chen
(74) *Attorney, Agent, or Firm* — Carlson, Gaskey & Olds

(57) ABSTRACT

An electron beam vapor deposition apparatus includes a coating chamber including a coating zone for depositing a coating on a work piece. A coating device includes at least one crucible for presenting at least one source coating material. The coating device includes a first deposition mode of depositing the at least one source coating material and a second deposition mode of depositing the at least one source coating material. At least one electron beam source evaporates the at least one source coating material for deposit onto the work piece. A controller is configured to control a speed of movement of the work piece in the coating zone during the coating operation in response to the first deposition mode and the second deposition mode.

13 Claims, 1 Drawing Sheet

OTHER PUBLICATIONS

Yang et al, "Dual Electron Beam Evaporator for the Preparation of Composition-Modulated Structures" Journal of Vacuum Science & Technology, vol. 2, No. 1, Jan. 1984, American Vacuum Society, New York, NY.

Australian Patent Office Corrected Written Opinion dated Dec. 13, 2010.
Australian Patent Office Search Report dated Nov. 10, 2010.

* cited by examiner

ELECTRON BEAM VAPOR DEPOSITION APPARATUS AND METHOD OF COATING

BACKGROUND OF THE INVENTION

This disclosure relates to an electron beam vapor deposition apparatus and method for depositing coatings with desirable microstructural orientations on work pieces.

Electron beam vapor deposition devices are known and used for depositing coatings, such as ceramic coatings, onto work pieces. For instance, airfoils for use in turbine engines may include ceramic coatings to protect an underlying metallic alloy from corrosion during engine operation. In some instances, there is a desire to form the coating with a columnar microstructure that is generally perpendicular to the underlying surface. The columnar structure increases the durability of the coating. However, available deposition processes are not practically economic or are incapable of depositing a suitable coating with the desired orientation on all surfaces of a work piece.

Generally, EB-PVD involves using an electron beam to melt and evaporate a source coating material. The evaporated material condenses on the work piece. However, EB-PVD is typically limited to depositing the coating on line-of-sight surfaces of the work piece that face toward the source coating material. EB-PVD is generally incapable or inadequate for depositing the ceramic coating on non-line-of-sight surfaces or surfaces that are steeply angled relative to the source, such as fillet portions of an airfoil or areas between paired turbine vanes.

Another process known as electron beam directed vapor deposition (EB-DVD) has more recently been used to deposit ceramic coatings on non-line-of-sight surfaces. Generally, EB-DVD is somewhat similar to EB-PVD except that a stream of carrier gas is used to carry the evaporated coating material from the coating material source toward the work piece. EB-DVD is capable of depositing the coating with the desired columnar structure on non-line-of-sight surfaces or in between the difficult to access areas, such as between airfoils of paired turbine vanes. However, the use of the carrier gas in EB-DVD adds significant expense to the process.

SUMMARY OF THE INVENTION

An exemplary electron beam vapor deposition apparatus includes a coating chamber including a coating zone for depositing a coating on a work piece. A coating device includes at least one crucible for presenting at least one source coating material. The coating device includes a first deposition mode of depositing the at least one source coating material and a second deposition mode of depositing the at least one source coating material. At least one electron beam source evaporates the at least one source coating material for deposit onto the work piece. A controller is configured to control a speed of movement of the work piece in the coating zone during the coating operation in response to the first deposition mode and the second deposition mode.

In another aspect, the electron beam vapor deposition apparatus may have the first deposition mode correspond to a physical vapor deposition mode and the second deposition mode correspond to a directed vapor deposition mode. The controller is configured to control the speed of movement of the work piece in the coating zone during a coating operation such that the work piece moves at a first speed in response to the PVD mode and a second, different speed in response to the DVD mode.

An exemplary method of coating a work piece using an electron beam vapor deposition apparatus as described above includes controlling the speed of movement of the work piece in the coating zone during a coating operation in response to the first deposition mode and the second deposition mode.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
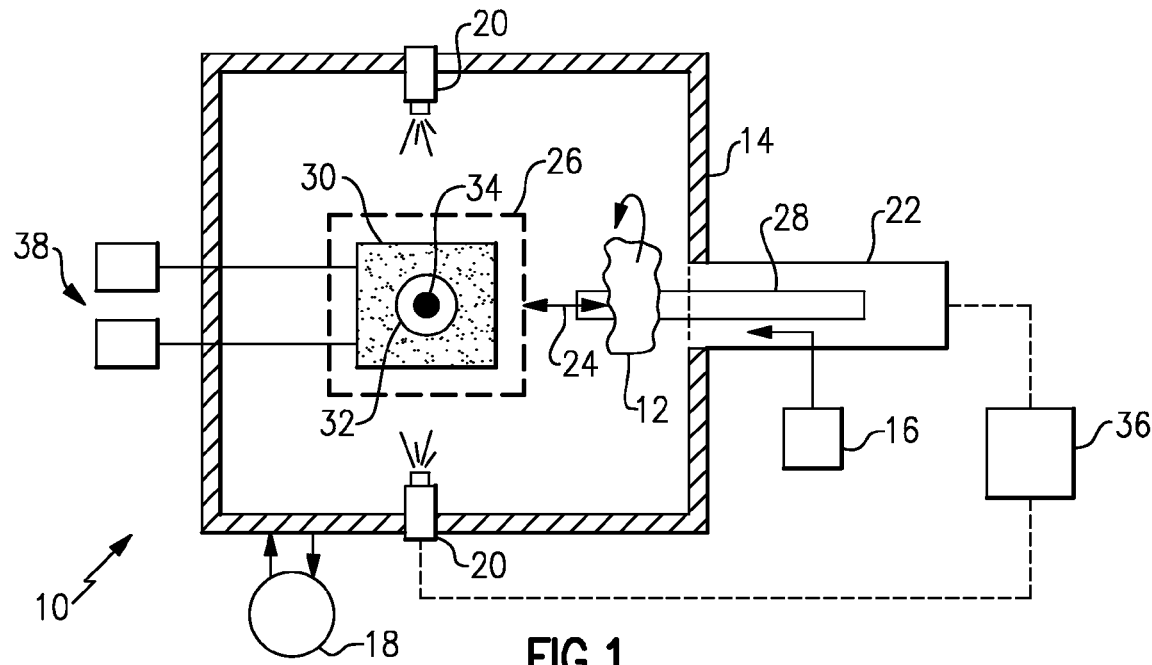
FIG. 1 illustrates an example electron beam vapor deposition apparatus.

FIG. 1 illustrates selected portions of an example electron beam vapor deposition apparatus 10 (hereafter "the deposition apparatus 10") for coating a work piece 12 (or work pieces 12), such as airfoils or paired turbine vanes of a gas turbine engine. For instance, the work piece 12 may include surfaces that are difficult to coat with a desired coating microstructural orientation because the geometry of the work piece 12. That is, the work piece 12 may have angled or curved surfaces and/or surfaces having low clearance relative to another surface. Such is the case with turbine vane segments, for example, which have angled fillet surfaces with the platform and airfoils with a relatively small gap therebetween.

The example deposition apparatus 10 is not limited to use for any particular type of work piece 12. Additionally, the type of coating deposited onto the work piece 12 may be any coating that is suitable for vapor deposition, such as metallic coatings or ceramic coatings. For example, the coating may be a ceramic thermal barrier coating that includes gadolinia, zirconia, yttria, or combinations thereof.

The deposition apparatus 10 includes a coating chamber 14 for containing the work pieces 12 during a coating operation and establishing desirable coating conditions. For instance, the coating chamber 14 may be a vacuum chamber and may include various ports for evacuating the interior or for selectively introducing process gases. A gas source 16 may provide a desired flow of oxygen or other process gas into the coating chamber 14. Optionally, a pump 18 may circulate a coolant (e.g., water) through walls of the coating chamber 14 to control wall temperature.

As is known, the work piece 12 may be pre-heated prior to insertion into the coating chamber 14 to form a thermally grown oxide on the work piece 12. The oxide is intended to enhance adhesion of the coating on the work piece 12.

At least one electron beam source 20, such as an electron gun, is mounted relative to the coating chamber 14 for melting and evaporating a source coating material 34, such as an ingot. In the disclosed example, two electron beam sources 20 are shown; however, the deposition apparatus 10 may alternatively include a single electron beam source 20 or more than two electron beam sources 20. Given this description, one of ordinary skill in the art will recognize an appropriate number of the electron beam sources 20 to meet their particular needs.

A transport 22 is configured to hold and move the work piece 12 back and forth in direction 24 to move the work piece 12 in and out of the coating chamber 14 and in and out of a coating zone 26 where the work piece 12 is to be coated. For instance, the coating zone 26 may be the spatial volume in the coating chamber 14 where the work piece 12 is coated. In this example, the transport 22 includes a shaft 28 that may be adapted to receive one or more fixtures that hold one or more of the work pieces 12. The shaft 28 may be translated in a known manner using a motor, actuator, or the like.

A coating device 30 is located near the coating zone 26, such as below the coating zone 26, and includes at least one crucible 32 for presenting at least one source coating material 34 that is to be deposited onto the work piece 12. For instance, the coating device 30 may include a single crucible that is used for different deposition modes of the deposition apparatus 10. Alternatively, the coating device 30 may include multiple crucibles 32 that correspond to different deposition modes, as will be described below. A desirable stand-off distance may be established between the coating device 30 and the coating zone 26 and/or work piece 12, depending on the geometry of the work piece 12, settings of the electron beam source(s) 20, and other factors.

Optionally, the deposition apparatus 10 may also include a thermal hood (not shown) arranged near the coating zone 26 to facilitate temperature control. As an example, one thermal hood is disclosed in application co-pending and commonly-owned Ser. No. 12/196,368 entitled "DEPOSITION APPARATUS HAVING THERMAL HOOD" which is hereby incorporated by reference.

A controller 36 is in communication with the transport 22 and, optionally, the electron beam source 20 and possibly other components of the deposition apparatus 10 to control the operation thereof. The controller 36 may include software, hardware, or both for operating the deposition apparatus 10. The controller 36 may be configured to control movement of the work piece 12 in and out of the coating chamber 14 into the coating zone 26 and movement of the work piece 12 within the coating zone 26 during a coating operation.

The coating device 30 may also include one or more gas sources 38. For instance, the gas sources 38 may correspond to different deposition modes of the deposition apparatus 10. In one example, the coating device 30 includes a first deposition mode of depositing the source coating material 34 onto the work piece 12 and a second deposition mode for depositing the source coating material 34 onto the work piece 12. The first and second deposition modes correspond to different deposition techniques, such as physical vapor deposition (PVD) and directed vapor deposition (DVD). That is, the coating device 30 may be configured for physical vapor deposition during one portion of a coating cycle and for directed vapor deposition mode in another portion of the coating cycle. Thus, the deposition apparatus 10 is not limited to using a single deposition technique and may be utilized to cost effectively use multiple deposition techniques. That is, a more expensive technique, such as DVD, can be used to coat only the non-line-of-sight surfaces while a less expensive technique, such as PVD, can be used to coat line-of-sight surfaces.

The controller 36 is configured to control a speed of movement of the work piece 12 in the coating zone 26 during a coating cycle in response to the first deposition mode and the second deposition mode. For instance, the controller 36 may change the speed of movement of the work piece 12 depending upon whether the coating device 30 is in the first deposition mode or the second deposition mode. The speed of movement may refer to the rotational speed of the work piece 12 in revolutions per minute while in the coating zone 26.

As an example, the controller 36 may move the work piece 12 using the transport 22 at a first speed when the coating device 30 is in the first deposition mode and at a second, different speed for the second deposition mode. In a case where the first deposition mode corresponds to a physical vapor deposition process, the speed may be relatively fast to coat line-of-sight surfaces of the work piece 12. In the case where the second deposition mode corresponds to a directed vapor deposition process, the speed may be relatively slow or static to facilitate depositing the coating on non-line-of-sight surfaces of the work piece 12, which may require longer coatings times than line-of-sight surfaces. Thus, the controller 36 may change the speed of movement of the work piece 12 in conjunction with switching between the deposition modes depending on whether the deposition apparatus 10 is coating a line-of-sight surface or a non-line-of-sight surface of the work piece 12.

As may be appreciated, the controller 36 may also control supply of gas flow from the one or more gas sources 38 to the coating device 30 depending on the deposition mode. For instance, the coating device 30 may utilize a first type of gas from one of the gas sources 38 when in the first deposition mode and a second type of gas flow from another of the gas sources 38 when in the second deposition mode. Alternatively, the coating device 30 may utilize a first gas flow rate for one of the deposition modes a second, different gas flow rate for the other deposition mode. In another example, the coating device 30 may not utilize any gas for one of the deposition modes and may use gas in the other deposition mode. In regard to PVD and DVD modes, the PVD mode may use no gas or a relatively low flow rate of gas (compared to DVD), and the DVD mode uses gas as a carrier of evaporated source coating material 34.

Figure 2:
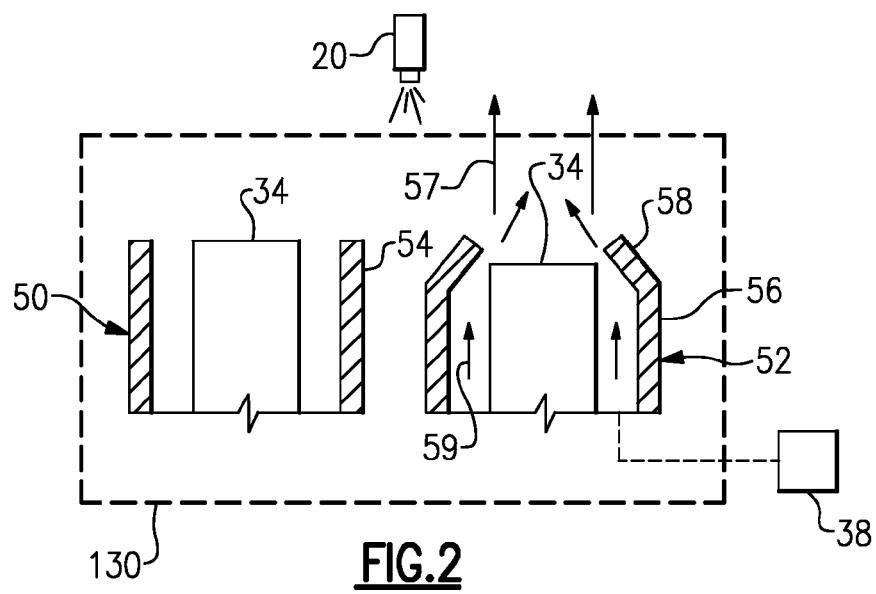
FIG. 2 illustrates an example coating device for use in an electron beam vapor deposition apparatus.

FIG. 2 illustrates an example of a coating device 130 that may be used in the deposition apparatus 10. The coating device 130 is adapted for PVD deposition and DVD deposition. In this example, the coating device 30 includes a PVD crucible 50 and a DVD crucible 52. For instance, the PVD crucible 50 includes a cylindrical wall that contains the source coating material 34, which may be connected to an actuator in a known manner for moving the source coating material 34 as it is consumed in the coating process. In this example, the PVD crucible 50 is not connected to any of the gas sources 38. However, in other examples, the PVD crucible 50 may be connected to one of the gas sources 38 for providing a relatively low flow of gas through or near the PVD crucible 50.

The DVD crucible 52 includes side walls 56. The side walls 56 form a nozzle portion 58 that is in a funnel shape for jetting a gas stream 57 of the evaporated source coating material 34 entrained in a carrier gas 59 from one of the gas sources 38. The gas stream 57 is directed toward the coating zone 26. Within the gas stream 59 there are randomized collisions between particles of the evaporated source coating material 34. The randomized collisions cause the particles to deflect off of surfaces of the work piece 12 in a random manner. The deflected particles may then deposit onto adjacent surfaces in a desirable microstructural orientation. It is to be understood that the specific shape of the DVD crucible 52 is not limited to the example shown and may have other shapes or may be designed for the specific requirements of the shape of the work piece 12.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. An electron beam vapor deposition apparatus comprising:
   a coating chamber for depositing a coating on a work piece;
   a coating device including at least one crucible for presenting at least one source coating material, the coating device having a physical vapor deposition mode of depositing the at least one source coating material and a directed vapor deposition mode of depositing the at least one source coating material; wherein the at least one crucible includes a funnel-less physical vapor deposition crucible and a directed vapor deposition nozzle having a funnel for jetting a gas stream therefrom;
   at least one electron beam source for evaporating the at least one source coating material; and
   a controller configured to move a transport holding the work piece at a first speed in response to the physical vapor deposition mode and at a second, different speed in response to the directed vapor deposition mode.

2. The electron beam vapor deposition apparatus as recited in claim 1, further comprising at least one gas source for delivering a carrier gas to carry evaporated source coating material, wherein the first deposition mode utilizes a first gas flow rate from the at least one gas source and the second deposition mode utilizes a second gas flow rate from the at least one gas source that is greater than the first gas flow rate.

3. The electron beam vapor deposition apparatus as recited in claim 1, further comprising at least one gas source connected with the coating device.

4. The electron beam vapor deposition apparatus as recited in claim 1, wherein the physical deposition mode corresponds to a line-of-sight deposition process and the directed vapor deposition mode corresponds to a non-line-of-sight deposition process.

5. The electron beam vapor deposition apparatus as recited in claim 1, wherein the first speed and the second speed are rotational speeds.

6. The electron beam vapor deposition apparatus as recited in claim 5, wherein the second speed is slower than the first speed.

7. The electron beam vapor deposition apparatus as recited in claim 5, wherein the first speed and the second speed are non-static speeds.

8. The electron beam vapor deposition apparatus as recited in claim 1, wherein the controller is in communication with the at least one electron beam source to control the operation thereof.

9. The electron beam vapor deposition apparatus as recited in claim 1, wherein the controller is in communication with the transport to control the operation thereof.

10. An electron beam vapor deposition apparatus comprising:
    a coating chamber for depositing a coating on a work piece;
    a coating device including at least one crucible for presenting at least one source coating material, the coating device having a physical vapor deposition (PVD) mode of depositing the at least one source coating material and a directed vapor deposition (DVD) mode of depositing the at least one source coating material; wherein the coating device includes a funnel-less physical vapor deposition crucible and a directed vapor deposition nozzle having a funnel for jetting a gas stream therefrom;
    at least one electron beam source for evaporating the at least one source coating material;
    a transport configured to hold and move a work piece in the coating zone; and
    a controller configured to control a speed of movement of the work piece in the coating zone during a coating operation such that the work piece moves at a first speed in response to the PVD mode and a second, different speed in response to the DVD mode.

11. The electron beam vapor deposition apparatus as recited in claim 10, further comprising at least one gas source, wherein the PVD mode utilizes a first gas flow rate from the at least one gas source and the DVD mode utilizes a second gas flow rate from the at least one gas source that is greater than the first gas flow rate.

12. The electron beam vapor deposition apparatus as recited in claim 10, further comprising at least one gas source connected with the coating device.

13. The electron beam vapor deposition apparatus as recited in claim 10, wherein the first deposition mode corresponds to a line-of-sight deposition process and the second deposition mode corresponds to a non-line-of-sight deposition process.

* * * * *